United States Patent
Arai et al.

(10) Patent No.: US 10,236,254 B1
(45) Date of Patent: Mar. 19, 2019

(54) SEMICONDUCTOR MEMORY DEVICE

(71) Applicant: TOSHIBA MEMORY CORPORATION, Tokyo (JP)

(72) Inventors: Fumitaka Arai, Yokkaichi Mie (JP); Satoshi Nagashima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/923,488

(22) Filed: Mar. 16, 2018

(30) Foreign Application Priority Data

Sep. 19, 2017 (JP) ................. 2017-178712

(51) Int. Cl.
*H01L 23/528* (2006.01)
*H01L 23/522* (2006.01)
*H01L 27/11582* (2017.01)

(52) U.S. Cl.
CPC ........ *H01L 23/528* (2013.01); *H01L 23/5228* (2013.01); *H01L 27/11582* (2013.01)

(58) Field of Classification Search
CPC ............. H01L 23/528; H01L 23/5228; H01L 27/11582
See application file for complete search history.

(56) References Cited

U.S. PATENT DOCUMENTS

| | | | |
|---|---|---|---|
| 8,878,278 | B2 | 11/2014 | Alsmeier et al. |
| 9,431,412 | B1 | 8/2016 | Kato et al. |
| 9,508,731 | B2 | 11/2016 | Wolstenholme |
| 2013/0126959 | A1 | 5/2013 | Aburada et al. |
| 2015/0200199 | A1 | 7/2015 | Sakamoto et al. |
| 2016/0336336 | A1 | 11/2016 | Nagashima et al. |
| 2017/0012050 | A1 | 1/2017 | Kato et al. |

FOREIGN PATENT DOCUMENTS

| | | |
|---|---|---|
| JP | 2013-110295 A | 6/2013 |
| JP | 2017-010951 A | 1/2017 |

*Primary Examiner* — Anthony Ho
(74) *Attorney, Agent, or Firm* — Foley & Lardner LLP

(57) ABSTRACT

A semiconductor memory device includes first and second insulating plates, a stacked body provided between the first insulating plate and the second insulating plate, and a semiconductor member. The stacked body includes interconnect layers. The interconnect layer includes a first interconnect portion contacting the first insulating plate, a second interconnect portion contacting the second insulating plate, a third interconnect portion, a fourth interconnect portion, fifth and sixth interconnect portions are separated from the first and the second insulating plates. The fifth interconnect portion is connected to the first interconnect portion via the third interconnect portion, and is insulated from the second interconnect portion. The sixth interconnect portion is connected to the second interconnect portion via the fourth interconnect portion, and is insulated from the first interconnect portion. The semiconductor member is disposed between the fifth interconnect portion and the sixth interconnect portion.

8 Claims, 9 Drawing Sheets

SEMICONDUCTOR MEMORY DEVICE

CROSS-REFERENCE TO RELATED APPLICATIONS

This application is based upon and claims the benefit of priority from Japanese Patent Application No. 2017-178712, filed on Sep. 19, 2017; the entire contents of which are incorporated herein by reference.

FIELD

Embodiments relate to a semiconductor memory device.

BACKGROUND

In recent years, a stacked type semiconductor memory device has been proposed in which memory cells are integrated three-dimensionally. In the stacked type semiconductor memory device, a stacked body is formed in which interconnect layers and insulating layers are stacked alternately; semiconductor members that extend in the stacking direction are provided inside the stacked body; and charge storage members are provided between the interconnect layers and the semiconductor members. Thereby, memory cell transistors are formed at each crossing portion between the interconnect layers and the semiconductor members. In such a stacked type semiconductor memory device, the resistance value of the interconnect layer undesirably increases when increasing the arrangement density of the semiconductor members to increase the integration of the memory cell transistors.

DETAILED DESCRIPTION

A semiconductor memory device according to an embodiment includes a first insulating plate, a second insulating plate, a stacked body, an insulating member, a semiconductor member, and a charge storage member. The first insulating plate and a second insulating plate spread along a plane including a first direction and a second direction, and are separated from each other in a third direction. The second direction crosses the first direction. The third direction crosses the plane. The stacked body is provided between the first insulating plate and the second insulating plate. The stacked body includes a plurality of insulating layers and a plurality of interconnect layers stacked alternately along the first direction. The insulating member is provided inside the stacked body. The insulating member pierces the stacked body in the first direction. The semiconductor member extends in the first direction and is provided inside the stacked body. The charge storage member is provided between the semiconductor member and the interconnect layers. Each of the interconnect layers includes a first interconnect portion extending in the second direction and contacting the first insulating plate, a second interconnect portion extending in the second direction and contacting the second insulating plate, a third interconnect portion contacting the first interconnect portion, a fourth interconnect portion contacting the second interconnect portion, a fifth interconnect portion, and a sixth interconnect portion. The fifth interconnect portion extends in the second direction, is separated from the first insulating plate and the second insulating plate, is connected to the first interconnect portion via the third interconnect portion, and is insulated from the second interconnect portion by the insulating member. The sixth interconnect portion extends in the second direction, is separated from the first insulating plate and the second insulating plate, is connected to the second interconnect portion via the fourth interconnect portion, and is insulated from the first interconnect portion by the insulating member. The semiconductor member is disposed between the fifth interconnect portion and the sixth interconnect portion.

Embodiments of the invention will now be described.

Figure 1:
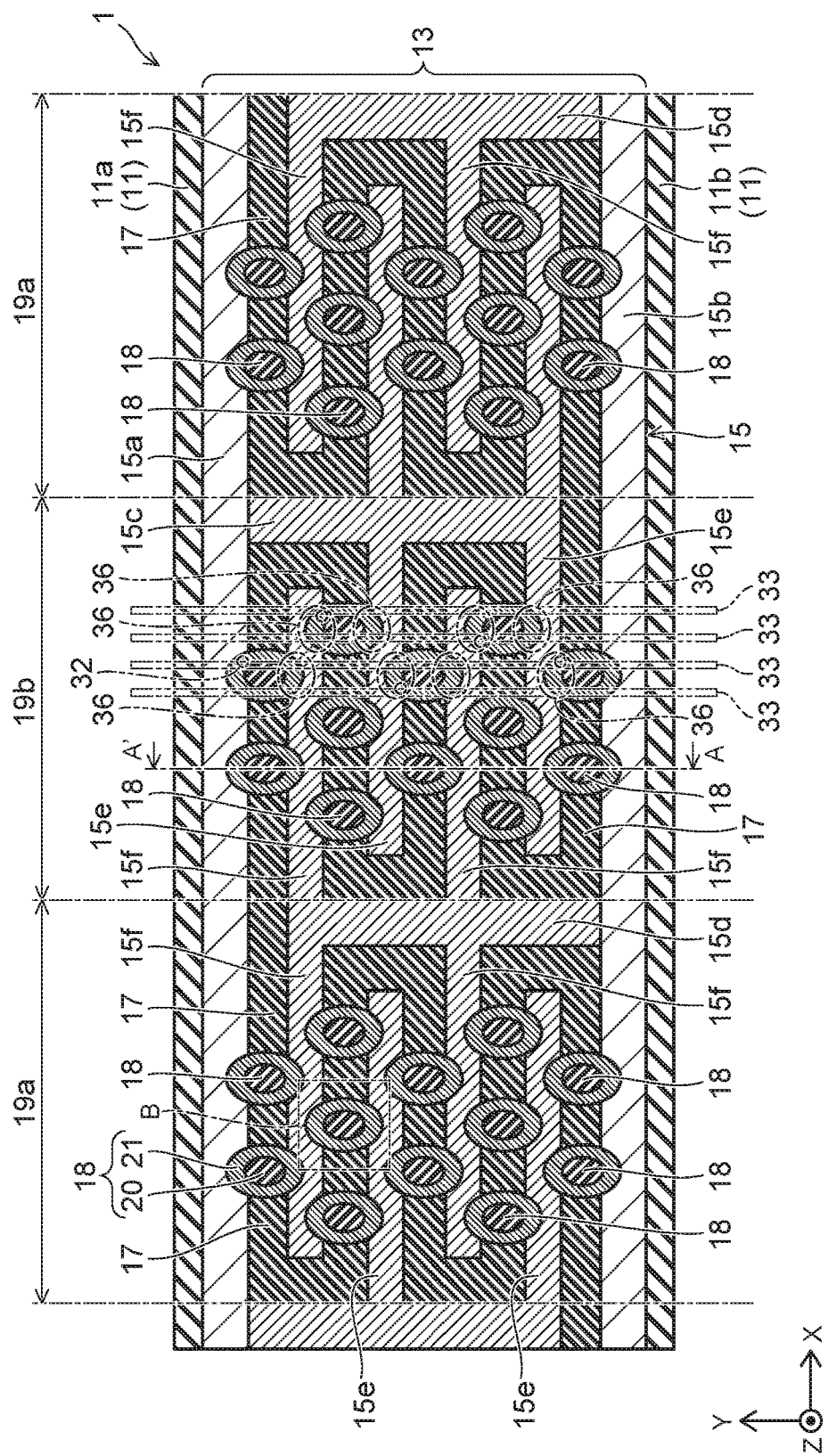
FIG. 1 is a cross-sectional view showing a semiconductor memory device according to an embodiment.

FIG. 1 is a cross-sectional view showing a semiconductor memory device according to the embodiment.

Figure 2:
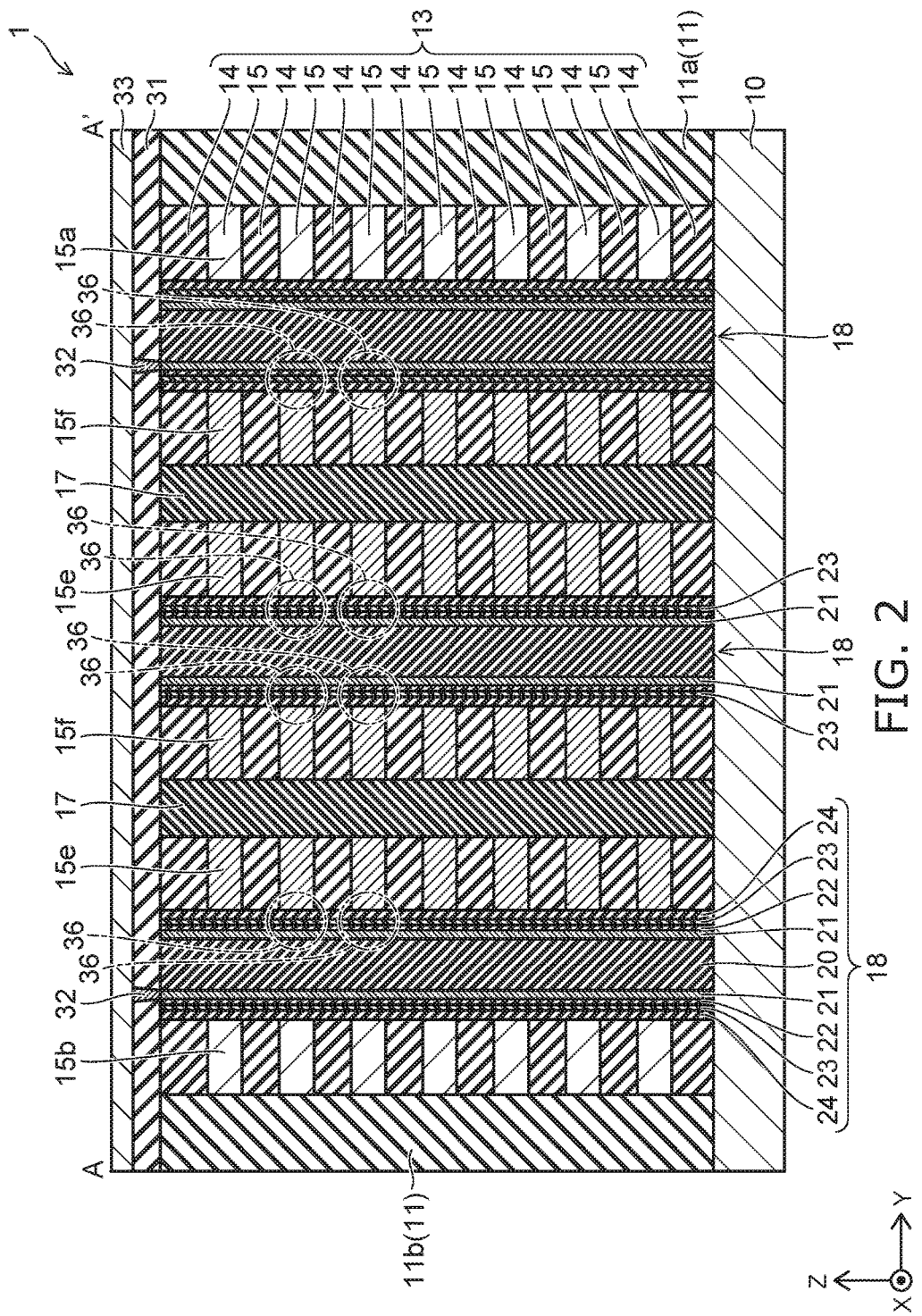
FIG. 2 is a cross-sectional view along line A-A' shown in FIG. 1.

FIG. 2 is a cross-sectional view along line A-A' shown in FIG. 1.

Figure 3:
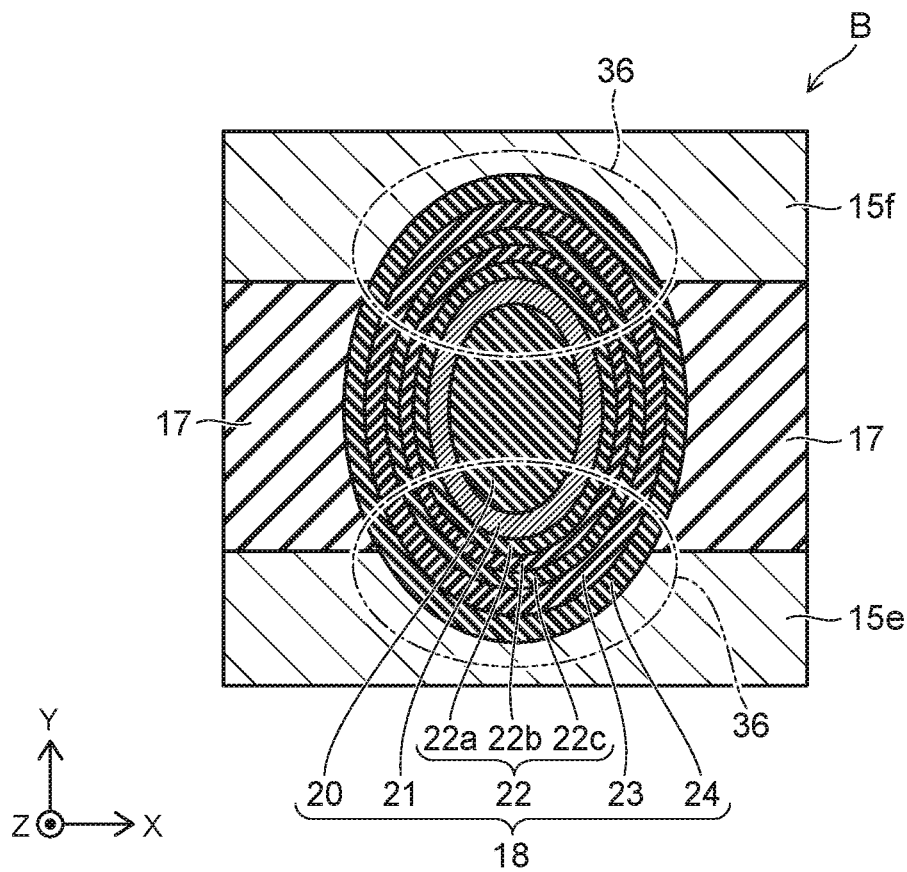
FIG. 3 is a partially enlarged cross-sectional view showing region B of FIG. 1.

FIG. 3 is a partially enlarged cross-sectional view showing region B of FIG. 1.

As shown in FIG. 1 and FIG. 2, a silicon substrate 10 is provided in the semiconductor memory device 1 according to the embodiment. Multiple insulating plates 11 are provided on the silicon substrate 10 and are separated from each other at uniform spacing. For example, the insulating plates 11 are formed of silicon oxide (SiO).

In the specification hereinbelow, an XYZ orthogonal coordinate system is employed for convenience of description. The direction from the silicon substrate 10 toward the insulating plate 11 is taken as "up;" and the reverse direction is taken as "down." However, these expressions are for convenience and are independent of the direction of gravity. Up and down are generally referred to as a "Z-direction." The arrangement direction of the insulating plates 11 is taken as a "Y-direction." A direction that is orthogonal to the Z-direction and the Y-direction is taken as an "X-direction."

In the specification, "silicon substrate" refers to a substrate including silicon (Si) as a major component. This is similar for the other components as well; and in the case where the material name is included in the name of the component, the material is a major component of the component.

Each of the insulating plates 11 spreads along the XZ plane. In other words, for each of the insulating plates 11, the length in the X-direction and the length in the Z-direction are longer than the length in the Y-direction. The lower end of each of the insulating plates 11 contacts the silicon substrate 10. Although the multiple insulating plates 11 are provided in the semiconductor memory device 1 as described above, FIG. 1 shows only two mutually-adjacent insulating plates 11 and the configuration between the two mutually-adjacent insulating plates 11. The configuration between any other two mutually-adjacent insulating plates 11 also is similar to the configuration shown in FIG. 1. For convenience of description hereinbelow, one of the two insulating plates 11 shown in FIG. 1 also is called the insulating plate 11a; and the other of the two also is called the insulating plate 11b.

A stacked body 13 is provided between the insulating plate 11a and the insulating plate 11b. Multiple insulating layers 14 and multiple interconnect layers 15 are stacked alternately along the Z-direction in the stacked body 13. The insulating layers 14 are formed of, for example, silicon oxide.

An insulating member 17 that pierces the stacked body 13 in the Z-direction is provided inside the stacked body 13. The insulating member 17 is formed of, for example, silicon oxide. The lower end of the insulating member 17 contacts the silicon substrate 10. Columnar members 18 that extend in the Z-direction also are provided inside the stacked body 13. The lower ends of the columnar members 18 contact the silicon substrate 10. The internal configuration of the columnar member 18 is described below.

The XY cross section that includes the interconnect layer 15 of the stacked body 13 includes the interconnect layer 15, the insulating member 17, and the columnar members 18. The XY cross section that includes the insulating layer 14 of the stacked body 13 includes the insulating layer 14, the insulating member 17, and the columnar members 18. Although the description hereinbelow is for the configuration of the XY cross section including the interconnect layer 15, this is similar for the XY cross section including the insulating layer 14 as well.

Unit regions 19a and 19b are set in the stacked body 13 and arranged alternately along the X-direction. In each of the unit regions 19a, the interconnect layer 15, the insulating member 17, and the columnar members 18 are arranged to have a prescribed positional relationship. The positional relationship in the unit region 19b between the interconnect layer 15, the insulating member 17, and the columnar members in the XZ plane is the mirror image of the positional relationship in the unit region 19a.

The configuration of the interconnect layer 15 in each of the unit regions will now be described.

As described above, the interconnect layer 15 is disposed between the insulating plate 11a and the insulating plate 11b. The interconnect layer 15 is partitioned into multiple portions by the insulating member 17. In other words, highway portions 15a and 15b, bridge portions 15c and 15d, and finger portions 15e and 15f are provided in the interconnect layer 15.

The highway portion 15a contacts the insulating plate 11a and extends in the X-direction. The highway portion 15b contacts the insulating plate 11b and extends in the X-direction. The highway portions 15a and 15b are formed of a conductive material including a metal, e.g., tungsten (W). In the specification, "extending in the X-direction" refers to the length in the X-direction of the member being longer than the length in the Y-direction and the length in the Z-direction. This is similar for the other directions as well.

The bridge portion 15c contacts the highway portion 15a and extends in the Y-direction from the highway portion 15a toward the highway portion 15b. However, the bridge portion 15c is separated from the highway portion 15b. The bridge portion 15d contacts the highway portion 15b and extends in the Y-direction from the highway portion 15b toward the highway portion 15a. However, the bridge portion 15d is separated from the highway portion 15a. The bridge portions 15c and 15d are formed of a conductive material including silicon, e.g., polysilicon.

The finger portions 15e and 15f extend in the X-direction, are separated from the insulating plates 11a and 11b, and are separated also from the highway portions 15a and 15b. The finger portion 15e is connected to the highway portion 15a via the bridge portion 15c and is insulated from the highway portion 15b by the insulating member 17. The finger portion 15f is connected to the highway portion 15b via the bridge portion 15d and is insulated from the highway portion 15a by the insulating member 17. The finger portions 15e and 15f are formed of a conductive material including silicon, e.g., polysilicon. Accordingly, the resistivities of the highway portions 15a and 15b are lower than the resistivities of the bridge portions 15c and 15d and the finger portions 15e and 15f.

Thus, the highway portion 15a, the bridge portion 15c, and the finger portion 15e are connected to each other electrically; and the highway portion 15b, the bridge portion 15d, and the finger portion 15f are connected to each other electrically. A first conductive portion that is made of the highway portion 15a, the bridge portion 15c, and the finger portion 15e and a second conductive portion that is made of the highway portion 15b, the bridge portion 15d, and the finger portion 15f are insulated from each other by the insulating member 17 and the columnar members 18. The first conductive portion and the second conductive portion are arranged in a meshing configuration. In other words, the finger portion 15e and the finger portion 15f are arranged alternately along the Y-direction.

In the embodiment, a total of four finger portions 15e extend toward the two X-direction sides from one bridge portion 15c. Also, a total of four finger portions 15f extend toward the two X-direction sides from one bridge portion 15d. However, this is not limited thereto; six or more finger portions 15e may extend from one bridge portion 15c; and six or more finger portions 15f may extend from one bridge portion 15d.

All of the multiple interconnect layers 15 included in the stacked body 13 and arranged along the Z-direction are partitioned into the same pattern. In other words, the interconnect patterns of the interconnect layers 15 each are made of the highway portions 15a and 15b, the bridge portions 15c and 15d, and the finger portions 15e and 15f and substantially overlap each other when viewed from the Z-direction for all of the interconnect layers 15.

When viewed from the Z-direction, the insulating member 17 and the columnar members 18 are disposed in a region of the stacked body 13 where the interconnect layer 15 is not disposed. In each of the unit regions 19a and 19b, the configuration of the region where the insulating member 17 and the columnar members 18 are disposed progresses in the Y-direction while meandering. The insulating member 17 is continuous between the unit region 19a and the unit region 19b adjacent to each other.

In the Y-direction, the columnar members 18 are disposed between the highway portion 15a and the finger portion 15f, between the finger portions 15f and the finger portions 15e, and between the finger portion 15e and the highway portion 15b. In the X-direction, the columnar members 18 are disposed between two insulating members 17. The length of the columnar member 18 in the Y-direction is longer than the length of the insulating member 17 in the Y-direction. Therefore, the two Y-direction end portions of the columnar member 18 jut from the insulating member 17 and jut into the interconnect layer 15.

As shown in FIG. 2 and FIG. 3, a core member 20 that is made of, for example, silicon oxide is provided in the columnar member 18. The configuration of the core member 20 is a substantially elliptical column of which the central axis extends in the Z-direction. The configuration of the core member 20 is not limited to an elliptical column and may be, for example, a substantially circular column or a substantially quadrilateral prism configuration having rounded corners.

A silicon pillar 21 is provided at the periphery of the core member 20. A tunneling insulating film 22 is provided at the periphery of the silicon pillar 21. Although the tunneling insulating film 22 normally is insulative, the tunneling insulating film 22 is a film in which a tunneling current flows when a prescribed voltage within the range of the drive voltage of the semiconductor memory device 1 is applied. A silicon oxide layer 22a, a silicon nitride layer 22b, and a silicon oxide layer 22c are stacked in order from the silicon pillar 21 side in the tunneling insulating film 22.

A charge storage film 23 is provided at the periphery of the tunneling insulating film 22. The charge storage film 23 is a film that can store charge, is made from, for example, an insulating material having trap sites of electrons, and is made of, for example, silicon nitride (SiN). A blocking insulating film 24 is provided at the periphery of the charge storage film 23. The blocking insulating film 24 is a film in which a current substantially does not flow even when a voltage within the range of the drive voltage of the semiconductor memory device 1 is applied. The blocking insulating film 24 is, for example, a single-layer silicon oxide film, or a stacked film made of a silicon oxide layer and an aluminum oxide layer.

The silicon pillar 21, the tunneling insulating film 22, the charge storage film 23, and the blocking insulating film 24 are disposed on substantially the entire side surface of the core member 20; and the configurations of these components are substantially elliptical tubes. The lower end of the silicon pillar 21 is connected to the silicon substrate 10. The tunneling insulating film 22, the charge storage film 23, and the blocking insulating film 24 are not illustrated in FIG. 1.

An insulating film 31 is provided on the stacked body 13; and plugs 32 are provided inside the insulating film 31. Bit lines 33 that extend in the Y-direction are provided on the insulating film 31. The bit lines 33 are connected to the upper ends of the silicon pillars 21 via the plugs 32. In FIG. 1, only a portion of the plugs 32 and the bit lines 33 is shown by double dot-dash lines.

Thereby, the charge storage films 23 are disposed between the silicon pillar 21 and the finger portion 15e of the interconnect layer 15 and between the silicon pillar 21 and the finger portion 15f and are included in memory cell transistors 36. In each of the memory cell transistors 36, the finger portion 15e or 15f is used as a gate; the silicon pillar 21 is used as a body including a channel; the tunneling insulating film 22 and the blocking insulating film 24 are used as a gate insulating film; and the charge storage film 23 is used as a charge storage member.

One silicon pillar 21 is connected to one bit line 33 via the plug 32. One memory cell transistor 36 is formed between the one silicon pillar 21 and the finger portion 15e; and another one memory cell transistor 36 is formed between the same silicon pillar 21 and the finger portion 15f. The finger portion 15e is connected to the highway portion 15a and insulated from the highway portion 15b. The finger portion 15f is connected to the highway portion 15b and insulated from the highway portion 15a. The lower ends of all of the silicon pillars 21 are connected to the silicon substrate 10. Therefore, one memory cell transistor 36 can be selected by selecting one bit line 33 and selecting the highway portion 15a or 15b of one interconnect layer 15.

Although the charge storage film 23 is disposed also between the highway portion 15a and the silicon pillar 21 and between the highway portion 15b and the silicon pillar 21, in the embodiment, these portions are not used as the memory cell transistors 36. Therefore, in one stacked body 13 as shown in FIG. 1, four memory cell transistors 36 are arranged along the Y-direction. In FIG. 1 and FIG. 2, only a portion of the memory cell transistors 36 is shown by circles of double dot-dash lines.

A method for manufacturing the semiconductor memory device according to the embodiment will now be described.

Figure 4:
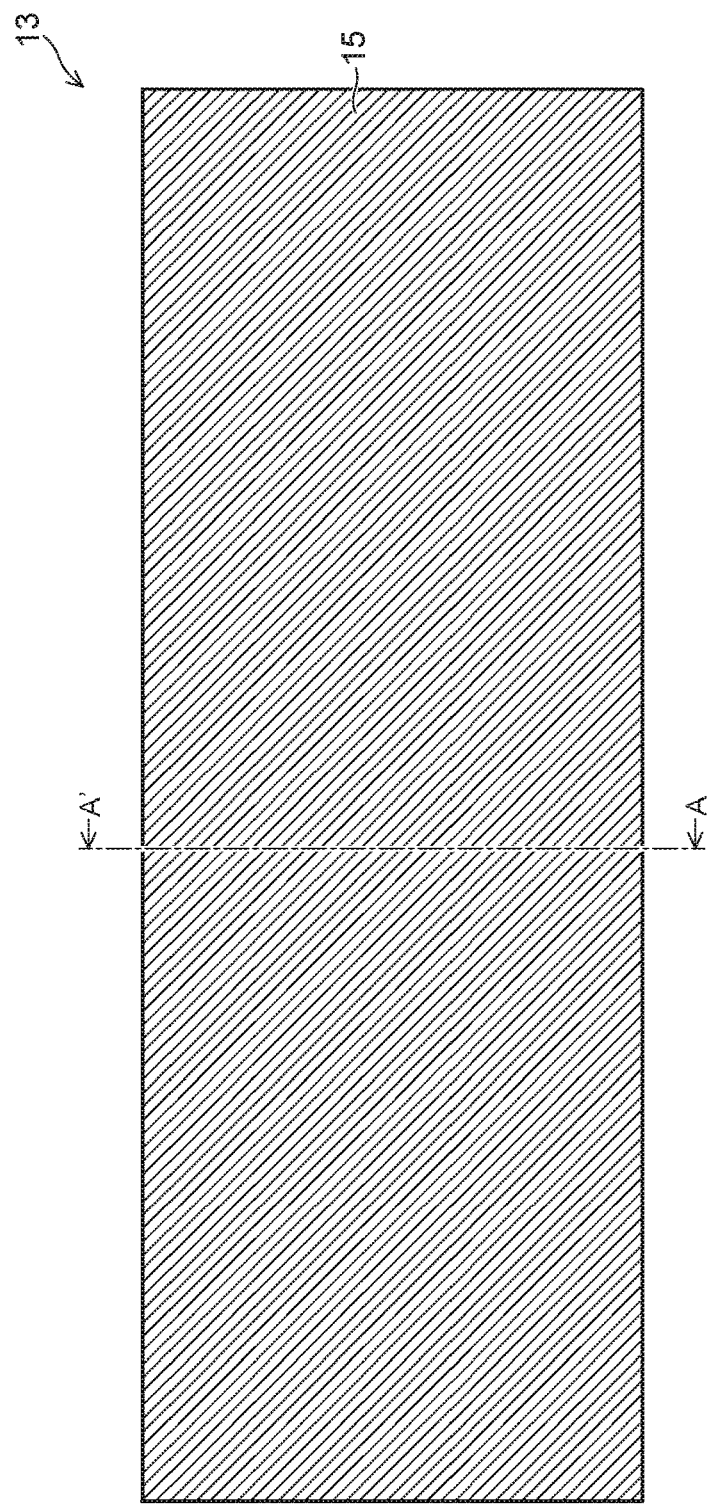
FIG. 4 is a cross-sectional view showing a method for manufacturing the semiconductor memory device according to the embodiment.

FIG. 4 is a cross-sectional view showing the method for manufacturing the semiconductor memory device according to the embodiment.

Figure 5:
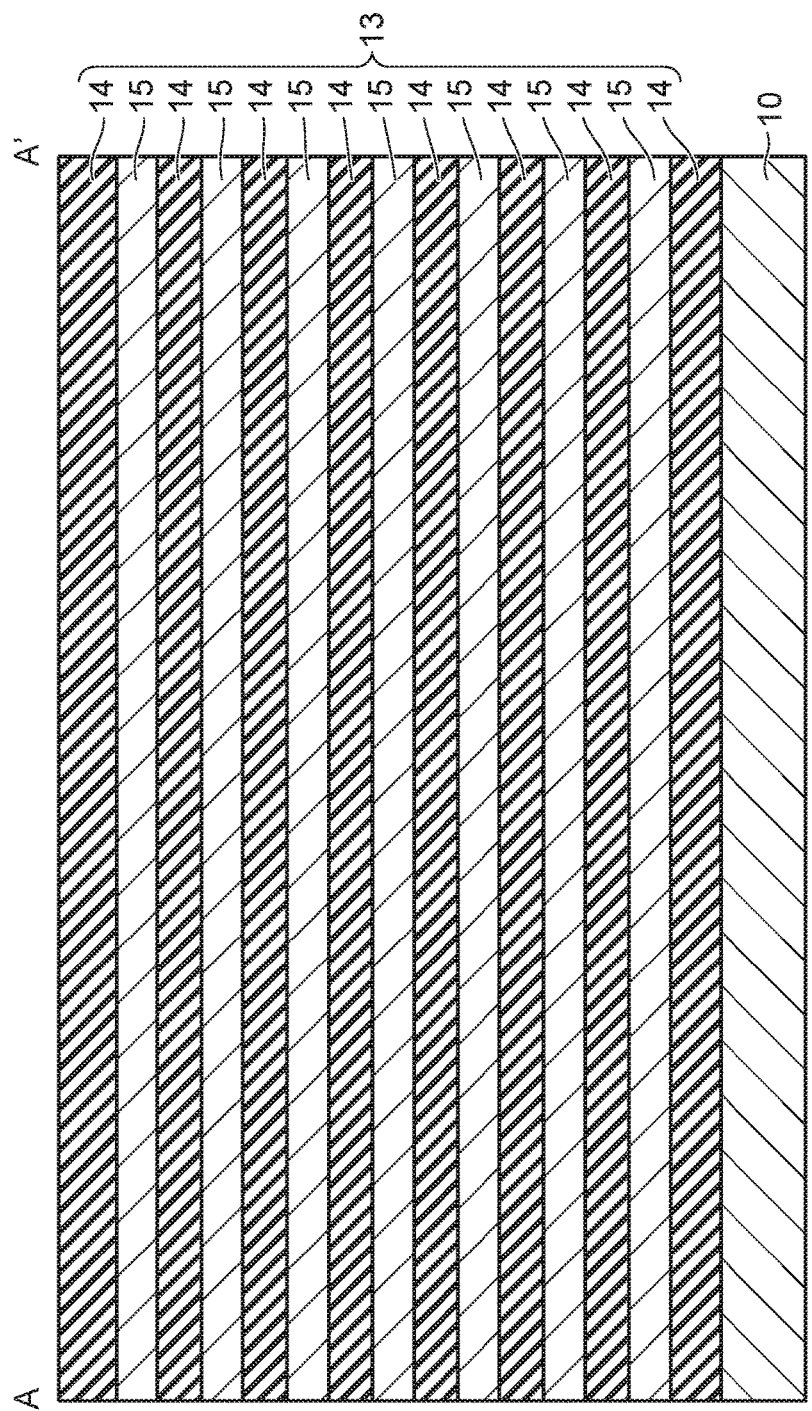
FIG. 5 is a cross-sectional view along line A-A' shown in FIG. 4.

FIG. 5 is a cross-sectional view along line A-A' shown in FIG. 4.

Figure 6:
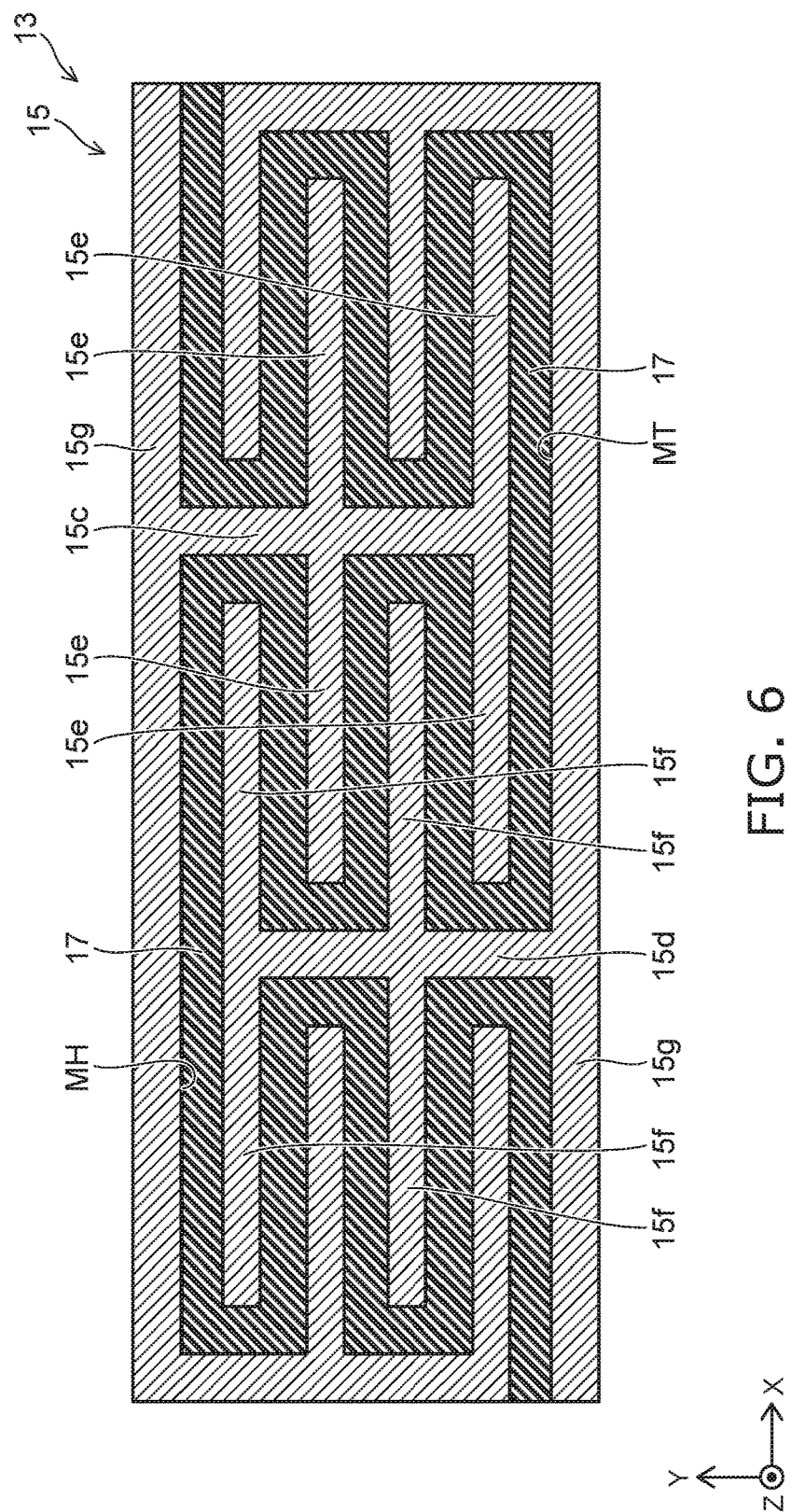
FIG. 6 to FIG. 8 are cross-sectional views showing the method for manufacturing the semiconductor memory device according to the embodiment.
Figure 7:
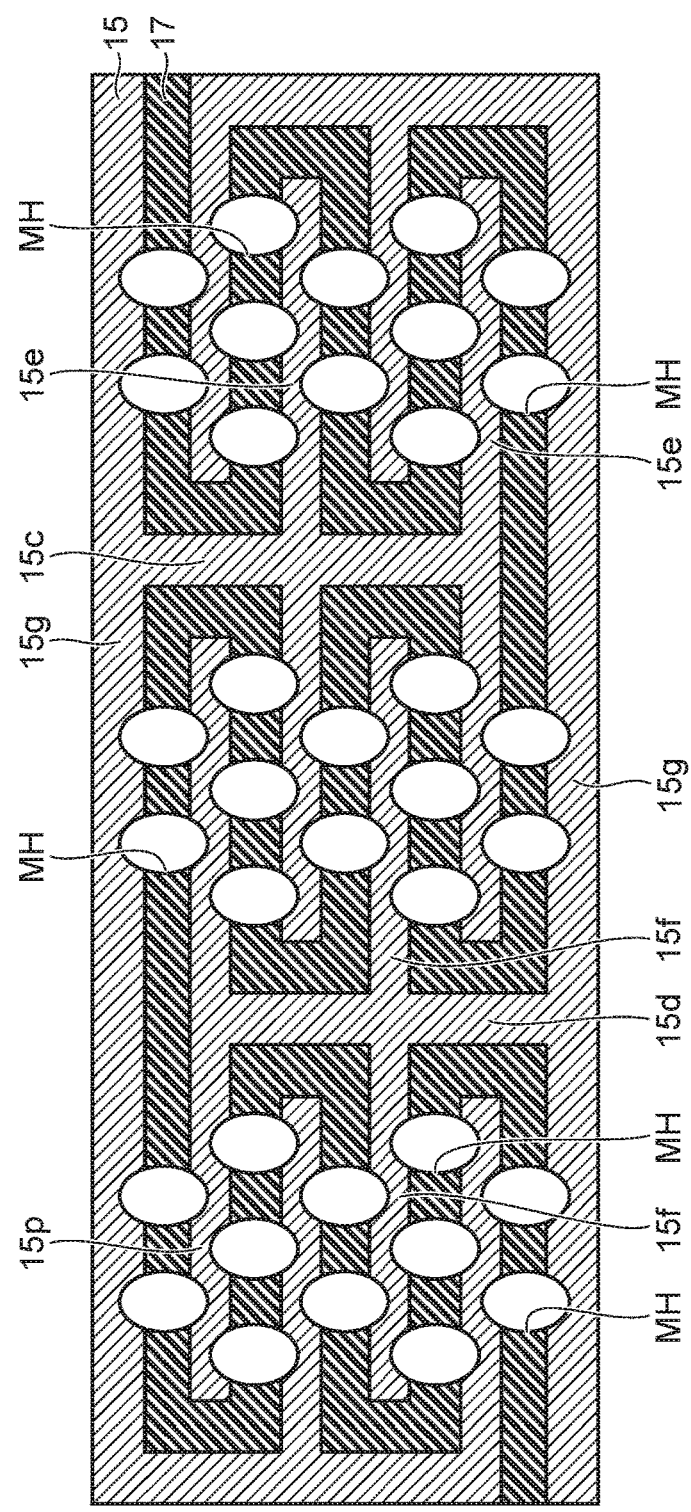
Figure 8:
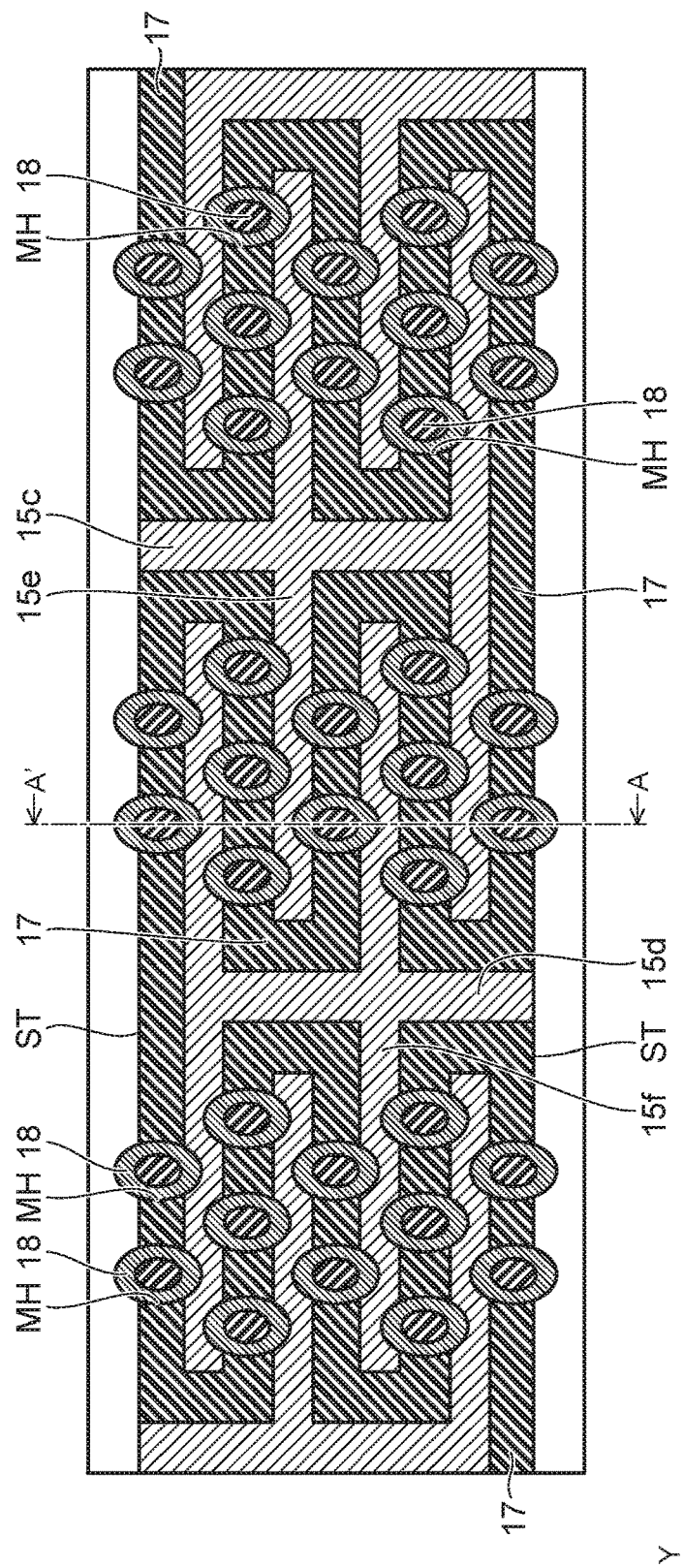

FIG. 6 to FIG. 8 are cross-sectional views showing the method for manufacturing the semiconductor memory device according to the embodiment.

Figure 9:
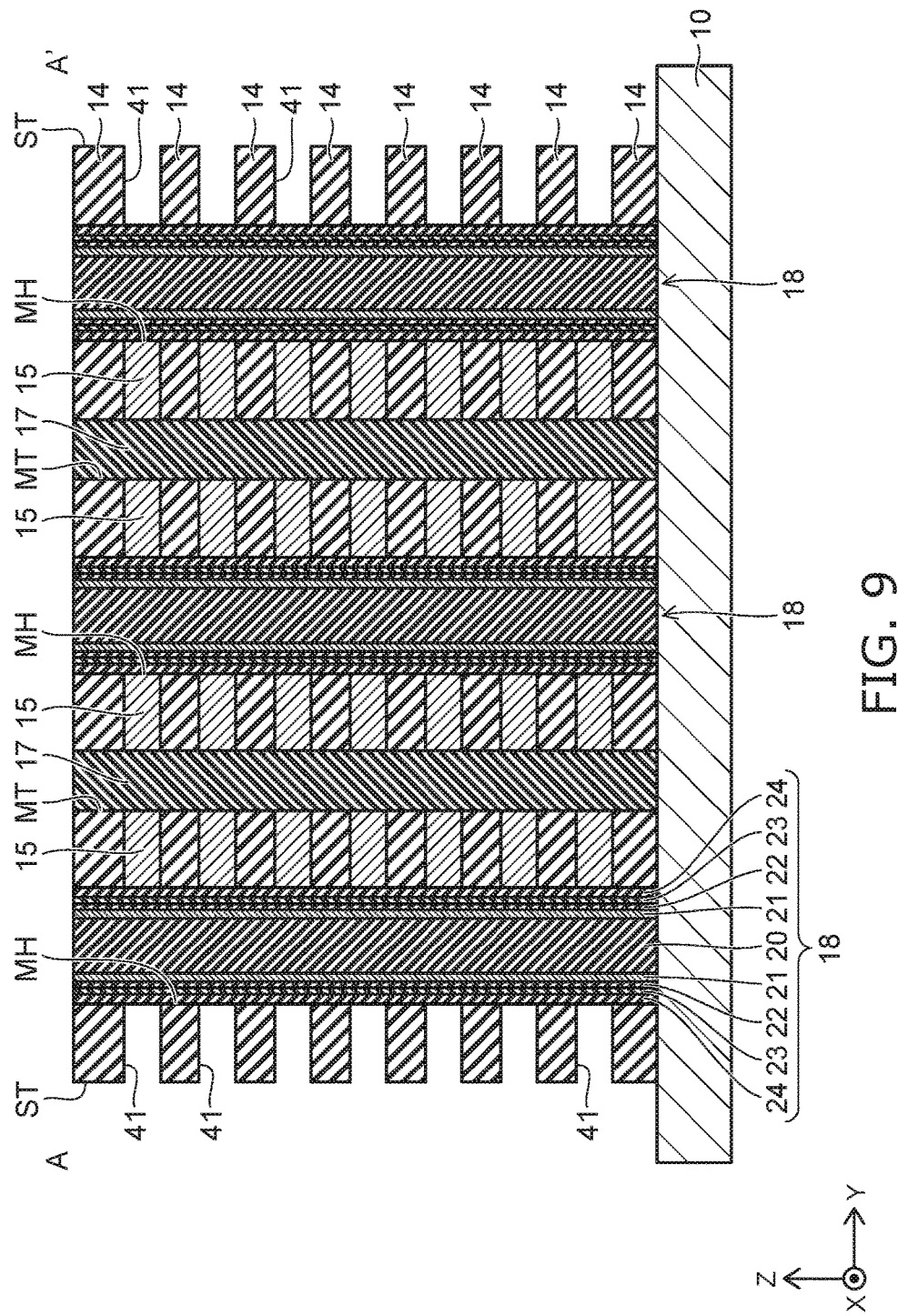
FIG. 9 is a cross-sectional view along line A-A' shown in FIG. 8.

FIG. 9 is a cross-sectional view along line A-A' shown in FIG. 8.

First, as shown in FIG. 4 and FIG. 5, the stacked body 13 is formed on the silicon substrate 10 by alternately stacking the insulating layer 14 and the interconnect layer 15. The insulating layer 14 is formed of silicon oxide; and the interconnect layer 15 is formed of polysilicon.

Then, as shown in FIG. 6, a memory trench MT is formed in the stacked body 13. The memory trench MT pierces the stacked body 13 in the Z-direction and reaches the silicon substrate 10. When viewed from the Z-direction, the configuration of the memory trench MT is a configuration in which wave-shaped portions that extend in the Y-direction as an entirety while oscillating in the X-direction are linked in the X-direction while folding back at the Y-direction end portions. Then, for example, the insulating member 17 is formed inside the memory trench MT by filling an insulating material such as silicon oxide, etc. Thereby, a highway portion 15g, the bridge portions 15c and 15d, and the finger portions 15e and 15f are formed in the interconnect layer 15. The highway portion 15g is a portion that is subdivided into the highway portion 15a and the highway portion 15b in a subsequent process.

Then, as shown in FIG. 7, memory holes MH are formed to divide the portions of the insulating member 17 extending in the X-direction. For example, the configuration of the memory hole MH is an elliptical column having the Z-direction as the axis direction and the Y-direction as the major-diameter direction. The memory holes MH pierce the stacked body 13 in the Z-direction and reach the silicon substrate 10.

Continuing as shown in FIG. 8 and FIG. 9, the blocking insulating film 24, the charge storage film 23, the tunneling insulating film 22, and the silicon pillar 21 are formed on the inner surface of the memory hole MH. The lower end of the silicon pillar 21 is connected to the silicon substrate 10. Then, for example, the core member 20 is formed by filling silicon oxide into the space surrounded with the silicon pillar 21. Thereby, the columnar member 18 is formed inside the memory hole MH.

Then, a slit ST that reaches the silicon substrate 10 is formed in the Y-direction central portion of the portion of the stacked body 13 where the highway portion 15g is disposed. When viewed from the Z-direction, the configuration of the slit ST is a line configuration extending in the X-direction. Thereby, the highway portion 15g is subdivided into the highway portion 15a (referring to FIG. 1) and the highway portion 15b (referring to FIG. 1). As a result, the interconnect layer 15 is subdivided into the first conductive portion made of the highway portion 15a, the bridge portion 15c, and the finger portion 15e, and the second conductive portion made of the highway portion 15b, the bridge portion 15d, and the finger portion 15f.

Continuing, the highway portions 15a and 15b that are made of polysilicon are removed by, for example, performing isotropic etching such as wet etching, etc., via the slit ST. Then, a conductive material that includes a metal, e.g., tungsten is deposited and filled into a space 41 where the highway portions 15a and 15b were removed. Then, the tungsten that is inside the slit ST is removed. Thereby, the material of the highway portions 15a and 15b is replaced with tungsten from polysilicon.

Then, as shown in FIG. 1 and FIG. 2, the insulating plates 11 are formed by filling silicon oxide into the slit ST (referring to FIG. 8 and FIG. 9). Then, the insulating film 31 is formed on the stacked body 13 and the insulating plates 11; the plugs 32 are formed inside the insulating film 31; and the bit lines 33 that extend in the Y-direction are formed on the insulating film 31. The bit lines 33 are connected to the silicon pillars 21 via the plugs 32. Thus, the semiconductor memory device 1 according to the embodiment is manufactured.

Effects of the embodiment will now be described.

In the semiconductor memory device 1 according to the embodiment, the multiple columnar members 18 are arranged along the Y-direction inside one stacked body 13 disposed between the two mutually-adjacent insulating plates 11. Thereby, multiple, e.g., four memory cell transistors 36 are arranged along the Y-direction inside one stacked body 13. Therefore, the bit density of the memory cell transistors 36 is high in the semiconductor memory device 1.

In the semiconductor memory device 1 according to the embodiment, the first conductive portion that is made of the highway portion 15a, the bridge portion 15c, and the finger portion 15e and the second conductive portion that is made of the highway portion 15b, the bridge portion 15d, and the finger portion 15f are insulated from each other by the insulating member 17 and the columnar members 18. Therefore, one memory cell transistor 36 can be selected by selecting one bit line 33 and selecting the highway portion 15a or 15b of one interconnect layer 15.

In the semiconductor memory device 1 according to the embodiment, the highway portions 15a and 15b are provided in the interconnect layer 15. The highway portions 15a and 15b extend in line configurations in the X-direction without interposed obstacles such as the columnar members 18, etc., and are formed of a low-resistance material such as tungsten, etc. Therefore, the resistance of the highway portions 15a and 15b is low. The finger portions 15e and 15f that are used as the gates of the memory cell transistors 36 are connected respectively to the highway portions 15a and 15b via the bridge portions 15c and 15d. Therefore, the interconnect resistance of the interconnect layer 15 to the portion used as the gate of the memory cell transistor 36 is low.

According to the embodiment, in the process shown in FIG. 8 and FIG. 9, the highway portions 15a and 15b that have a low resistance can be formed by replacing the polysilicon outside the columns of the columnar members 18 with a metal material such as tungsten, etc., without causing the etching for removing the polysilicon to progress past the columns of the columnar members 18. Therefore, the productivity is high for the semiconductor memory device 1 according to the embodiment.

Thus, according to the embodiment, a semiconductor memory device can be realized in which the integration of the memory cell transistors 36 is high and the resistance value of the interconnect layer 15 is low.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first insulating plate and a second insulating plate spreading along a plane and being separated from each other in a third direction crossing the plane, the plane including a first direction and a second direction, the second direction crossing the first direction;
   a stacked body including a plurality of insulating layers and a plurality of interconnect layers and being provided between the first insulating plate and the second insulating plate, the plurality of insulating layers and the plurality of interconnect layers being stacked alternately along the first direction;
   an insulating member provided inside the stacked body, the insulating member piercing the stacked body in the first direction;
   a semiconductor member extending in the first direction and being provided inside the stacked body; and
   a charge storage member provided between the semiconductor member and the interconnect layers,
   each of the interconnect layers including
      a first interconnect portion extending in the second direction and contacting the first insulating plate,
      a second interconnect portion extending in the second direction and contacting the second insulating plate,
      a third interconnect portion contacting the first interconnect portion,
      a fourth interconnect portion contacting the second interconnect portion,
      a fifth interconnect portion extending in the second direction, being separated from the first insulating plate and the second insulating plate, being connected to the first interconnect portion via the third interconnect portion, and being insulated from the second interconnect portion by the insulating member, and
      a sixth interconnect portion extending in the second direction, being separated from the first insulating plate and the second insulating plate, being connected to the second interconnect portion via the fourth interconnect portion, and being insulated from the first interconnect portion by the insulating member,
   the semiconductor member being disposed between the fifth interconnect portion and the sixth interconnect portion.

2. The device according to claim 1, wherein
   the first interconnect portion and the second interconnect portion include a metal, and
   the fifth interconnect portion and the sixth interconnect portion include silicon.

3. The device according to claim 2, wherein the metal is tungsten.

4. The device according to claim 1, wherein a resistivity of the first interconnect portion and the second interconnect portion is lower than a resistivity of the fifth interconnect portion and the sixth interconnect portion.

5. The device according to claim 1, wherein
each of the interconnect layers includes a plurality of the fifth interconnect portions and a plurality of the sixth interconnect portions, and
the plurality of fifth interconnect portions and the plurality of sixth interconnect portions are arranged alternately in the third direction.

6. The device according to claim 1, wherein the third interconnect portion and the fourth interconnect portion extend in the third direction.

7. The device according to claim 1, wherein interconnect patterns of the plurality of interconnect layers overlap each other when viewed from the first direction, the interconnect patterns each including the first to sixth interconnect portions.

8. The device according to claim 1, further comprising:
a semiconductor substrate; and
an interconnect extending in the third direction,
the stacked body being disposed between the semiconductor substrate and the interconnect in the first direction,
a first end of the semiconductor member being connected to the semiconductor substrate,
a second end of the semiconductor member being connected to the interconnect.

* * * * *